United States Patent [19]
Van Vaals et al.

[11] Patent Number: 5,951,472
[45] Date of Patent: Sep. 14, 1999

[54] MR SYSTEM AND INVASIVE DEVICE FOR INTERVENTIONAL PROCEDURES

[75] Inventors: Johannes J. Van Vaals; Johannes P. Groen, both of Eindhoven, Netherlands

[73] Assignee: U.S. Philips Corporation, New York, N.Y.

[21] Appl. No.: 08/960,249

[22] Filed: Oct. 29, 1997

[30] Foreign Application Priority Data

Nov. 4, 1996 [EP] European Pat. Off. .............. 96203065

[51] Int. Cl.⁶ .................................................. A61B 5/055
[52] U.S. Cl. ........................... 600/411; 600/423; 600/424
[58] Field of Search .................... 600/411, 423, 600/424; 324/309, 318, 322

[56] References Cited

U.S. PATENT DOCUMENTS 4,572,198  2/1986  Codrington .............................. 128/653
5,307,808  5/1994  Dumoulin et al. ....................... 600/423

FOREIGN PATENT DOCUMENTS

0543468A1  5/1993  European Pat. Off. .
WO 9301509  1/1993  WIPO .

*Primary Examiner*—Ruth S. Smith
*Attorney, Agent, or Firm*—Dwight H. Renfrew, Jr.

[57] ABSTRACT

An MR system for interventional procedures, includes an MR device and an invasive device. The MR device is arranged to acquire images of a part of an object. A part of the invasive device can be imaged in an MR image by providing a coil or a conductor loop which has two non-magnetic conductors which are situated at some distance from one another underneath the surface of the invasive device. A reduction of artefacts due to the movement of a patient or the invasive device can be obtained by sampling an MR signal, whereby an auxiliary magnetic field is periodically applied during the time in which the plurality of lines in k-space are scanned.

14 Claims, 6 Drawing Sheets

MR SYSTEM AND INVASIVE DEVICE FOR INTERVENTIONAL PROCEDURES

BACKGROUND OF THE INVENTION

1. Field of the Invention

The invention relates to a magnetic ("MR") resonance system for interventional procedures, including an MR device which is arranged to acquire images of a region of an object, the MR device including:

a) a magnet for generating a steady magnetic field, b) means for generating temporary magnetic gradient fields, comprising a read gradient and other temporary gradient fields orthogonal to the read gradient, c) means for generating RF-pulses, d) means for measuring MR signals, e) processing means for processing the MR signals measured so as to determine an image of the object, f) an invasive device which comprises means for generating an auxiliary magnetic field and g) a control unit for generating control signals for the means for generating the temporary gradient fields, the means for generating the RF-pulses and the means for generating the auxiliary magnetic field, the control unit being arranged such that the read gradient and one of the other temporary gradient fields are superposed on a steady magnetic field so that during measurement of the MR signal the k-space is scanned along a plurality of lines, and the auxiliary magnetic field is applied, the processing means further being arranged to determine a position of the invasive device within the object from changes in the measured MR signals as induced by the applied auxiliary magnetic field.

2. Description of the Related Art

All MR system of this kind is known from U.S. Pat. No. 4,572,198. It is to be noted that in the context of the present Patent Application an invasive device is to be understood to mean any instrument whose positioning is of importance, for example an instrument such as a guide wire or a biopsy needle. In the context of the present Patent Application k-space is to be understood as a spatial frequency domain in which an MR signal is measured along a trajectory and the measured values yield the inverse fourier transformed values of the image of the object. The trajectory in k-space is determined by the time integral of the applied temporary gradient fields over a time interval from the excitation RF-pulse to the actual measurement point in time of the MR signal.

In the known MR system the invasive device is positioned, in cooperation with the MR device, so as to subject the object to an interventional procedure for which the invasive device has been designed. This is, for example, angioplasty of a patient. Furthermore, in the known MR system the image processing means determines the position of a part of the invasive device in a slice of the object on the basis of two consecutive MR images of the patient. The auxiliary magnetic field is then switched off during the generating of the MR signals for the reconstruction of a first image, whereas it is switched on during the generating of the MR signals for the reconstruction of a next MR image. The auxiliary magnetic field generated by a coil provided in the part of the invasive device disturbs the magnetic fields generated by the MR device, so that a difference arises between the two MR images. The processing unit determines the position of the part of the invasive device on the basis of the changes in the two MR images. In a further step the position of the part of the invasive device is superposed, via a cursor, on the MR image of the body and displayed on a monitor.

It is a drawback of the known system that the accuracy of the position determined is affected by motion artefacts in the image of the invasive device or the object.

SUMMARY OF THE INVENTION

It is inter alia an object of the invention to reduce the influence of such motion artefacts on the accuracy of the position determined.

To this end, an MR system in accordance with the invention is characterized in that the control unit is further arranged such that the auxiliary magnetic field is periodically applied during the time in which the plurality of lines in the k-space is scanned. The effect of this measure is that changes in MR signals are less effected by movement of the invasive device or the object and the accuracy of the position determined for the invasive device is improved. This is because the time elapsing between the occurrence of differences in the MR signal wherefrom the position information is derived is substantially reduced in comparison with the acquisition time of one or two images required to derive the position in the known method.

An embodiment of an MR system in accordance with the invention is characterized in that the control unit is arranged such that the time during which the auxiliary magnetic field is applied, is shorter than the time in which a single line in the k-space is scanned, each line of the k-space being scanned two times, the processing means being further arranged to determine the position of the invasive device by complex subtraction of two measured MR signals corresponding to the same line in the k-space. Position information of the invasive device can thus be obtained with a higher accuracy. This is because the time elapsing between a first measurement of an MR signal influenced by the auxiliary magnetic field and a second measurement of an MR signal of the same line in k-space that has not been influenced by the auxiliary magnetic field is substantially shorter than the time elapsing between the subsequent acquisition of two MR images.

Another embodiment of an MR system in accordance with the invention is characterized in that the means for measuring the MR signals are arranged such that the MR signals are sampled with a sampling frequency and that the control unit is arranged such that the applied auxiliary magnetic field is applied during sampling of the MR signals and periodic with a frequency approximately equal to the original bandwidth of the MR-signals, the processing means being arranged such that the measured MR signals are Fourier transformed and the Fourier transformed values are separated into position information of the invasive device and image information of the object. The original bandwidth $BW_s$ of the MR signal is related to the Field of View (FOV) in meters within the object, to the strength of the applied read gradient (mT/m) and to the gyromagnetic ratio $\gamma$ (rad/sT), which is expressed in formula as $$BW_s = \frac{\gamma G_x FOV}{2\pi}.$$

The periodically applied auxiliary magnetic field $B_{aux}(x,y)$ having a repetition frequency $f_{aux}=BW_s$, induces a disturbance in the magnetization near a distal end of the invasive device at a position $(x_0,y_0)$. After 2D Fourier transformation the disturbance appears in the image at the positions $(x_0)$, $(x_0+D,y_0)$ and $(x_0-D,y_0)$, where $$D = \frac{2\pi f_{aux}}{\gamma_G}(m).$$

The Field of View (FOV) is defined as the dimensions of a part of the body that is imaged. The shift is a result of a first-order approximation of the induced disturbance of the phase of the magnetization and the translation properties of a Fourier transform pair. If the distance D is larger than the Field of View the image of the disturbance is shifted to a position outside the image of the object. The position information of the invasive device is then present near the left and right edges in the complex image and the image information of the object is present near the centre of the complex image. Hence, two separate images can be obtained: one image of the object and one image of the disturbance.

A further embodiment of an MR system in accordance with the invention is characterized in that the position of the invasive device is determined by combination of position information present near the left edge and position information present near the right edge of the complex image. The effect of the measure is that the signal-to-noise ratio of the position measurement of the invasive device is improved. This is because the information present at the left edge of the image is the same information, but has an opposite sign compared to that present near the right edge. The improvement in signal-to-noise ratio is then approximately $\sqrt{2}$.

A further embodiment of an MR system in accordance with the invention is characterized in the control unit is arranged to generate fast MR imaging sequences. The use of fast MR imaging sequences reduces the acquisition time for measuring MR signals so as to obtain images of the object, for example to the range of about 100 to 200 ms per image. As a result image artefacts due to movement of the body are further reduced. Fast imaging sequences are, for example a Fast Field Echo sequence (FFE), a Turbo Spin Echo sequence (TSE) and a GRAdient and Spin Echo sequence (GRASE). These sequences are known per se from inter alia EP-A 604441.

A further embodiment of an MR system in accordance with the invention is characterized in that the control unit it is also arranged to derive images from MR signals by means of a so-called keyhole technique. This step offers a further reduction of the acquisition time. This technique is known inter alia from EP-A 543468. The keyhole technique according to the cited Patent Application utilizes the MR signal set associated with the complete k-space so as to acquire a first image. Subsequently, only a part of the k-space is used to generate new MR signals which are subsequently substituted in the positions of the MR signals of the previously obtained MR signal set which are associated with the relevant part of the k-space. From this updated MR signal set a temporally subsequent image is determined.

A further embodiment of an MR system in accordance with the invention is characterized in that the position of the invasive device is tracked by automatically determining the position of the invasive device and automatically determining the position of a next slice to be imaged in the object from the position of the invasive device, thus determined. The effect of the tracking is that the position of the invasive device within the image of a slice is continuously monitored, even when the invasive device or the body is moved.

These and other aspects of the invention will be apparent from and elucidated with reference to the embodiments described hereinafter.

DETAILED DESCRIPTION OF THE PREFERRED EMBODIMENTS

Figure 1:
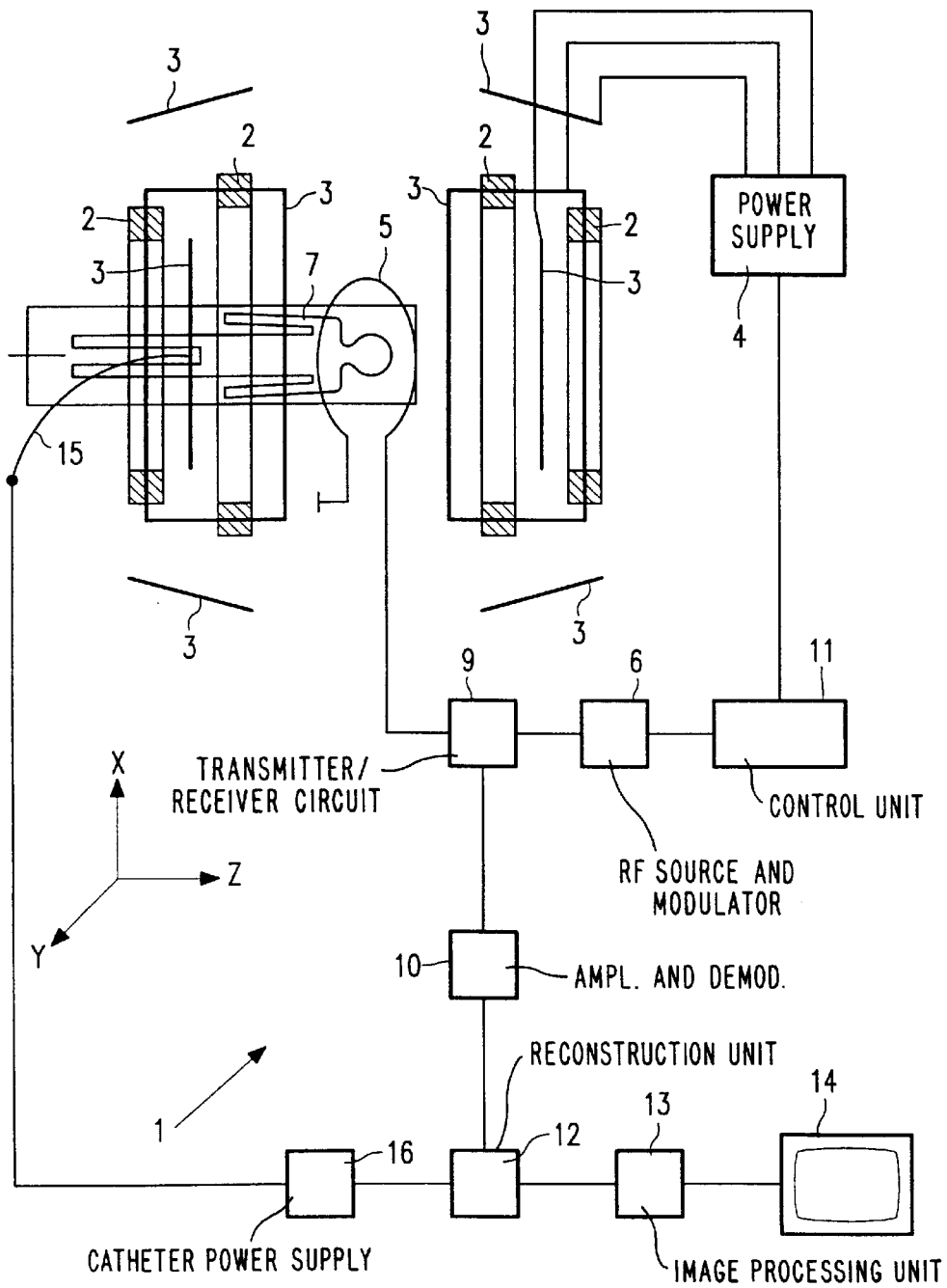
FIG. 1 shows an embodiment of an MR system.

FIG. 1 shows an embodiment of an MR system comprising an MR device 1 and an invasive device 15. The MR device 1 comprises a first magnet system 2 for generating a steady magnetic field. The z-direction of the coordinate system shown corresponds to the direction of the steady magnetic field in the magnet system 2. The MR system further comprises a second magnet system 3 for generating temporary magnetic fields directed in the z-direction and gradients in the x,y and z direction, respectively. It is to be noted that although for ease of argument x,y and z are used for the read-encode, phase encode and selection direction, respectively. These directions do not have to coincide with the main directions of the system. Furthermore, the temporary gradient fields having a gradient in the x-direction, y-direction and z-direction are referred to in this Application as read gradient, phase-encode gradient and slice-selection gradient, respectively. Power supply 4 feeds the second magnet system 3. The magnet system 2 encloses an examination space which is large enough to accommodate a part of an object 7 to be examined, for example a part of a human body. An RF transmitter coil 5 serves to generate RF magnetic fields and is connected to an RF source and modulator 6. The RF transmitter coil 5 is arranged around the part of a body 7 within the examination space. The system also comprises a receiver coil connected via a transmitter/receiver circuit 9 to a signal amplification and demodulation unit 10. The receiver coil 8 and the RF transmitter coil 5 may be one and the same coil. A control unit 11 controls the modulator 6 and the power supply 4 in order to generate imaging sequences comprising RF-pulses and temporary magnetic gradient fields. After excitation of nuclear spins in a part of the body placed within the examination space, the receiver coil 5 receives an MR signal. The phase and amplitude derived therefrom are sampled and further processed in the amplification and demodulation unit 10. An image reconstruction unit 12 processes the signals presented so as to form an image. Via an image processing unit 13 this image is displayed, for example on a monitor 14. The control unit 11 also controls the image reconstruction unit 12, the image processing unit 13 and a catheter power supply unit 16. FIG. 1 also shows a catheter 15 as an embodiment of an invasive device. The catheter 15 comprises a coil (not shown), which is connected to the catheter power supply unit 16.

Figure 2:
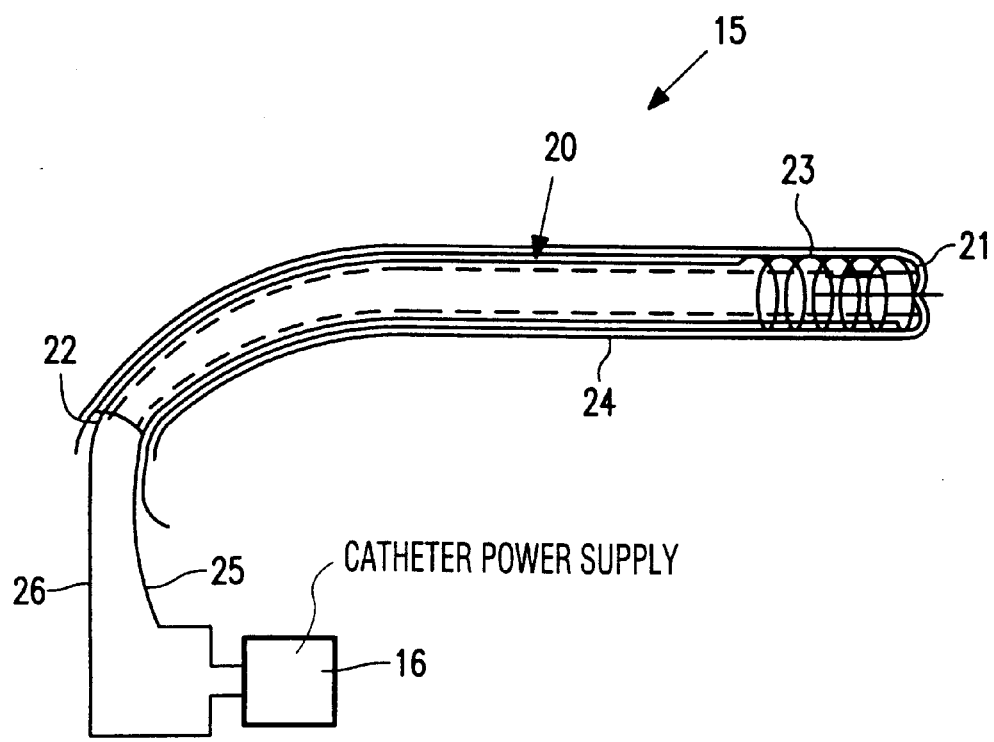
FIG. 2 shows an embodiment of an catheter comprising a coil.

FIG. 2 shows a detailed embodiment of the catheter. The catheter 15 comprises a duct 20, a distal end 21, a proximal end 22 and the coil 23. The catheter 15 is made of an electrically suitably insulating material of low magnetic susceptibility. The catheter 15 has a diameter which is, for example between 0.3 mm and 3 mm and has a fixed length in a range of, for example from about 110 to 150 cm. For the remainder the catheter 15 has a customary shape and construction including a hull 24. The duct 20 may be optional.

The coil 23 is provided, for example, near the distal end 21 directly underneath the surface and adjacent the duct 20 in the catheter 15. The coil 23 consists of a non-magnetic conductive material, for example copper wire, having a diameter of, for example 0.1 mm. The coil is connected to the catheter supply unit 16 via non magnetic electrical conductors 25,26. The coil can also be provided as a loop made of a non-magnetic conductor and extending along a substantial part of the catheter. The auxiliary magnetic field $B_{aux}$ is generated by a current $I_{aux}$ through the coil 23. The current $I_{aux}$ is supplied by the catheter supply unit 16. The control unit 11 controls the strength of the current $I_{aux}$ and the period in which the current $I_{aux}$ is applied to the coil 23.

The distal end 21 of the catheter 15 can be introduced into, for example a blood vessel of the body. Via the duct 20 further instruments can be introduced into the body; for example, thinner catheters or guide wires for controlling the catheter 15 can be inserted through the duct. Furthermore, contrast media or active substances, for example thrombolytic liquids, can also be administered via the catheter 15.

The invention will be explained, by way of example, for said MR system in combination with an Echo Planar Imaging sequence (EPI). The EPI imaging sequence is known per se from the cited EP-A-604441.

Figure 3A:
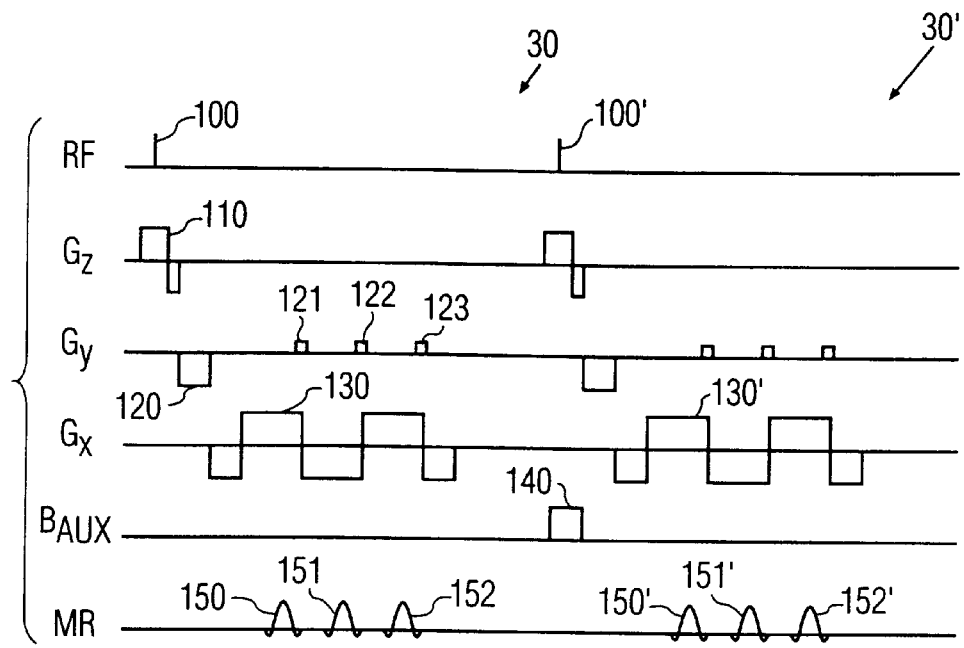
FIGS. 3A–B show EPI sequences.

FIG. 3A shows Echo Planar Imaging sequences 30 and 30' comprising a RF-excitation pulse and temporary magnetic gradient fields $G_x, G_y, G_z$. In FIG. 3A the temporary magnetic field $B_{aux}$ is also indicated in sequence 30'. The EPI sequence commences with the application of an RF-excitation pulse 100, having a flip angle α, and a slice selection gradient 110 to excite nuclear spins within a slice of the body 7 containing the distal end 21 of the catheter 15. The flip angle α is, for example 90°. After the slice selection an initial phase-encoding gradient 120 and a read gradient 130 are applied. Further phase-encoding gradients 121,122, 123, referred to as blips, are applied after the second and further lobes of the read gradient 130 in order to measure MR signals 150,151,152 along a plurality of parallel lines which are regularly distributed in the k-space and extend parallel to the $k_x$-axis. The EPI sequence is repeated for different values for the initial phase-encoding gradients in order to obtain a complete set of measured MR signals corresponding to, for example 128 or 256 lines in the k-space. An image can be reconstructed from the measured set of MR signals.

According to a first method of the invention, in a first step a first EPI sequence 30 is executed to measure, for example, three field echo MR signals 150,151,152 corresponding to three lines in k-space. In a further step of the method a first auxiliary magnetic field 140 is applied between the RF-excitation pulse 100' and the read gradient 130' in a further EPI sequence in order to measure again three MR signals 150', 151' and 152'. The first auxiliary magnetic field 140 induces a disturbance in the magnetization within the object near the coil 23. The last three MR signals measured correspond to the same three lines in k-space as those whereto the three MR signals of the first EPI sequence correspond. After reception and sampling of the MR signals of each EPI sequence, the sampled values of the MR signals received are stored in a reference and a measurement set, respectively.

By repeating the first and further EPI sequences 30' with different phase encoding gradients and by periodically applying the auxiliary magnetic field $B_{aux}$ in said manner, a complete reference set and a complete measurement set are obtained. A complete reference set or a complete measurement set comprises all the sampled values of the MR signals that correspond to the 128 or 256 lines in the k-space in order to reconstruct an image of the slice.

In a further step of the method the reconstruction unit 12 determines a difference set of the sampled complex values from the reference set and a reconstruction set by summation of the sampled complex values from the reference set and the measurement set corresponding to the same sample points on the same line in the k-space. A position of the distal end 21 of the catheter 15 is then derived by Fourier transformation of the difference set and an image of the object 7 is then reconstructed by Fourier transformation of the reconstruction set. The position of the distal end 21 thus derived is shown in the reconstructed MR image of the object 7 as an overlay or a cursor.

The strength of the current $I_{aux}$ required to induce a detectable disturbance according to the first method depends on the type and the shape of the coil 23 in the catheter 15 and on the time during which the current $I_{aux}$ is applied. These parameters can be determined experimentally by a skilled person.

The advantage of the method according to the invention is that motion artefacts due to motion of the object or motions of the catheter 15 within the object 7 are reduced because, the time elapsing between two subsequent measurements is reduced in relation to the known method in which the time between two measurement is equals the acquisition time of one image.

Furthermore, it is also possible to obtain a reference set, wherein an inverse auxiliary magnetic field is generated with a reversed current with respect to the current applied to generate the auxiliary magnetic field so as to obtain the measurement set. An advantage of this manner of modulation of the auxiliary magnetic field are that the maximum required becomes smaller for the same difference that results in less power dissipation.

Furthermore, automated recognition of the location of the catheter is possible because as a result of the subtraction the catheter will be the only visible structure in the image.

In said MR system the first method may also be applied in combination with, for example a known Turbo Spin Echo (TSE) sequence. The TSE sequence is known from, inter alia, the cited EP-A 604441. FIG. A4 shows an TSE sequence 40 comprising an RF-excitation pulse, three refocussing pulses and temporary magnetic gradient fields $G_x, G_y, G_z$. The TSE sequence commences with the generation of an RF-excitation pulse 200 having a flip angle α and a first slice selection gradient 210 to excite nuclear spin in a slice of the body 7. After slice selection an initial read gradient 230 is applied, followed by a first refocussing pulse 201 having a flip angle β and a second slice selection gradient 211. The flip angle α is for example 90° and the flip angle β is, for example 180°. After the refocussing pulse 201 a first phase encoding gradient 220 and a first read gradient 231 are applied. A first MR signal 250 is then measured during the first read gradient 231. After the first read gradient 231 a first phase-decoding gradient 221 is applied. Further MR signals 251,252 are measured by applying further refocussing pulses 202,203, both refocussing pulses having a flip angle β. A complete set of MR signals corresponding to, for example, 128 or 256 parallel lines in the k-space, extending parallel to the $k_x$-axis, is measured by repeating the TSE sequences 40 for different values of the phase-encoding gradient 220. Furthermore, in a TSE sequence the Carr, Purcell, Meibohm, Gill (CPMG) condition has to be fulfilled to avoid fast decay of the MR signal.

The CPMG condition states that in a TSE sequence the total phase change of the magnetization between two subsequent refocussing pulses equals half the phase change of the magnetization between the excitation pulse and the first refocussing pulse. The consequences for the applied TSE sequence are primarily that in the period of time between the first read gradient 231 and the second refocussing pulse 202 also a phase decoding gradient 221 has to be generated with a gradient opposing that of the phase encoding gradient 220 and also that if a first auxiliary magnetic field 240 (FIG. 4B) is applied before the read gradient 231 an inverse auxiliary magnetic field 241 must be applied also after the read gradient 231 and before the second refocussing pulse 202. The first inverse auxiliary magnetic field 241 has an opposed direction with respect to the first auxiliary magnetic field 240. The inverse auxiliary magnetic field 241 is induced by a reverse current $-I_{aux}$ through the coil 23.

Figure 4A:
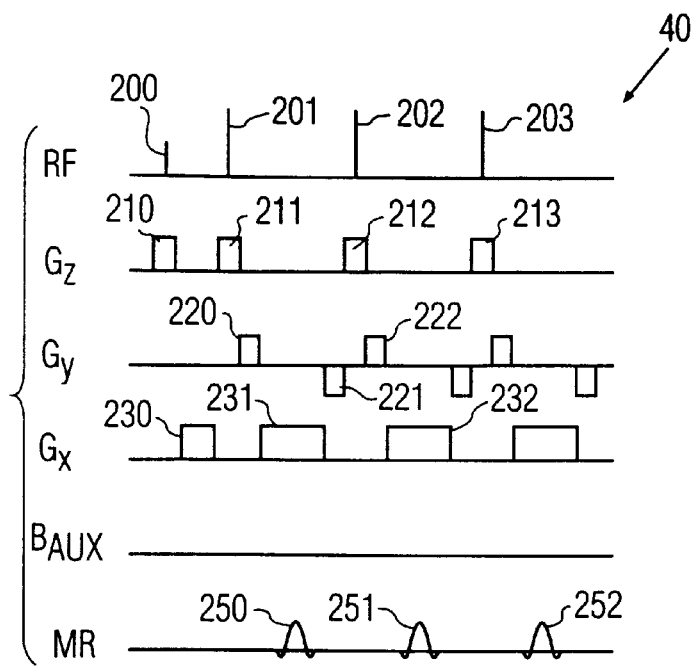
FIGS. 4A–D show TSE sequence.
Figure 4B:
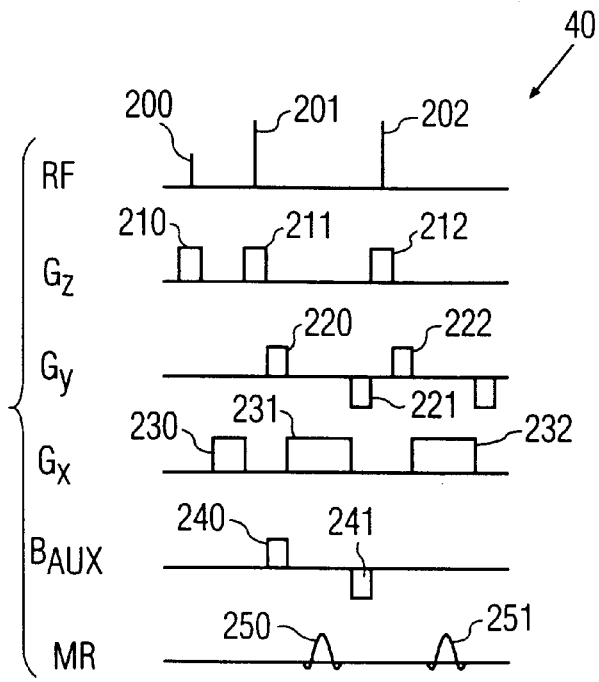

According to the invention as illustrated in FIG. 4B the first auxiliary magnetic field 240 and the first inverse magnetic field 241 are applied in said manner in a TSE sequence 40 applied to measure a first MR signal 250 and a second MR signal 251 such that each subsequent line in the k-space is scanned twice in direct succession. The first MR signal 250 corresponds to a first scan of a line in the k-space and the second MR signal 251 corresponds to a second scan of the same line in the k-space. The first MR signal 250 is influenced by the first auxiliary magnetic field 240 and the second MR signal 251 is not influenced by the first auxiliary magnetic field 240. The measured values are stored in a reference set and a measurement set, respectively. The described TSE sequence can be extended to a series of more than two MR signals by repeating the second refocussing pulse 202, the slice selection gradient 212, the phase encoding gradient 222, the phase decoding gradient 223 and the read gradient 232. Furthermore, in that extended TSE sequence the auxiliary magnetic fields are periodically applied such that only one of two successive MR signals is influenced. In order to obtain a complete reference set and a complete measurement set the TSE sequence 40 is repeated one or more times. In a further step position information of the catheter 15 and image information of the object 7 is then determined in the same way as described before in relation to the method in which EPI sequences are applied. The advantage of the first method in combination with TSE is that the time elapsing between two measurements of MR signals corresponding to the same line in the k-space is further reduced and hence also motion artefacts.

Figure 4C:
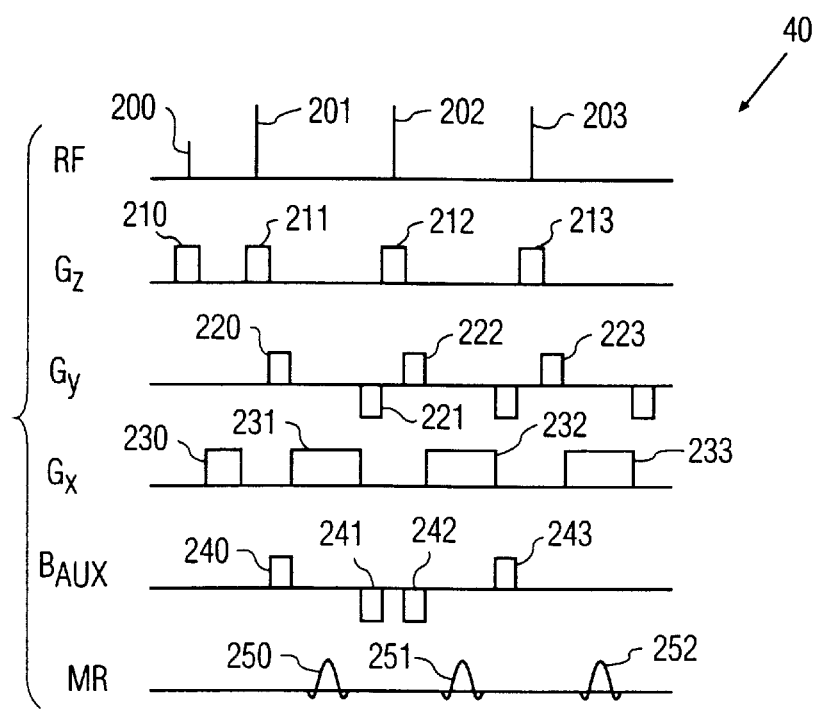

In order to improve the signal to noise ratio as illustrated in FIG. 4C of the reference set the inverse auxiliary magnetic field can be applied to influence the second MR signal 251 by generating the second inverse auxiliary magnetic field 242 between the second refocussing pulse 202 and the second read gradient 232 and by generating the second auxiliary magnetic field 243 after the second read gradient 232 and before the third refocussing pulse 203. The effect of this measure is that the disturbances are present in both MR signals but with opposite signs, so they will add in a subtraction of both MR signals. The third MR signal is not influenced by any auxiliary magnetic fields.

The strength of the current $I_{aux}$ required to induce a detectable disturbance depends on the type and shape of the coil 23 in the catheter 15 and can be determined experimentally or by calculation by a skilled person.

Although the first method of the invention is disclosed for an MR system in combination with an EPI or TSE sequence, other sequences such as a known Gradient and Spin Echo (GRASE) sequence are also possible. Said GRASE sequence is also known from, inter alia, the cited EP-A 604441.

A second method according to the invention will be illustrated again, by way of example, for said MR system in combination with an EPI sequence. The control unit 11 is arranged to generate EPI sequences to measure and sample MR signals from a slice of the body in which the distal end 21 of the catheter 15 is present. The original bandwidth of the MR-signals is determined by the formula $$BW_s = \frac{\gamma G_x FOV}{2\pi},$$

wherein FOV represents the Field of View in m, $G_x$ represents a temporary magnetic field having a gradient oriented the x-direction and expressed in mT/m, and $\gamma$ represents the gyromagnetic constant $\gamma$ in rad/sT. The sampling frequency is determined by the formula $f_s=2BW_s$. So, two times oversampling is assumed in the sampling of the MR signal. In practice, the sampling frequency of the MR signal is, for example, about 60 Khz. Furthermore, in the y-direction the FOV is determined by $$FOV = \frac{2\pi}{\gamma \Delta G_y T_y},$$

wherein $T_y$ represents the time during which the phase encoding gradient $G_y$ is applied during a preparation phase which is defined as the period between the excitation pulse and the application of the read gradient and that $\Delta G_y$ is the increment between two successive phase encoding gradients. The number of samples in the x-direction and the y-direction is for example 128, 128 or 256, 256 respectively.

Figure 3B:
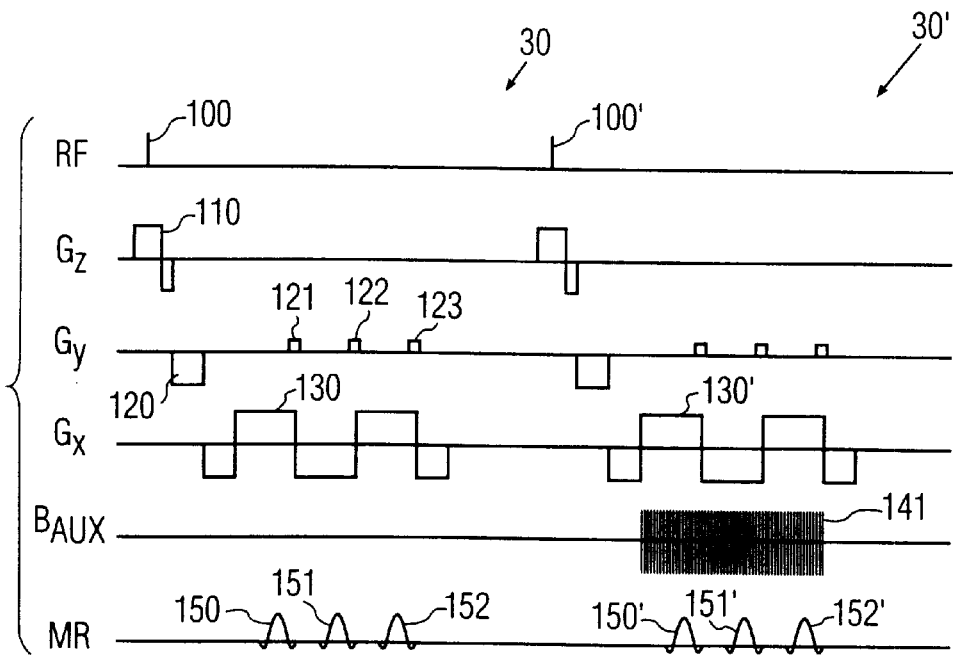

Furthermore, according to the invention in the EPI sequence a periodic magnetic field $B_{aux}(x,y)$ 141 with a repetition frequency $f_{aux}=BW_s$ is applied during the read gradient 130', as illustrated in FIG. 3B. The effect of the periodic magnetic field $B_{aux}$ is that a change in the magnetization vector is induced at a position $x_0,y_0$ in the slice comprising the distal end 21. That change in magnetization results in a widening of the spectrum of the measured MR signal. The spectrum $S(k_x,k_y)$ of the MR signal can be represented by the formula $$S(k_x,k_y) = \int M(x,y) \exp(i(k_x x + k_y y + \Phi_{aux}(x,y)\sin(D.k_x))) dx dy \quad (1)$$

For small values of $\Phi_{aux}(x,y)\sin(D.k_x)$ formula (1) can be approximated by $$S(x, y) \simeq \int M(x, y) \exp(i(k_x x + k_y y) \cdot (1 + i\Phi_{aux}(x, y)\sin(D \cdot k_x)) dx dy \quad (2)$$

$$= \int M(x, y) \exp(i(k_x x + k_y y)) \cdot$$

$$\left(1 + \frac{1}{2}\Phi_{aux}(x, y)\exp(iDk_x) - \frac{1}{2}\Phi_{aux}(x, y)\exp(-iDk_x)\right) dx dy$$

wherein $$\Phi_{aux}(x, y) = \frac{B_{aux}}{2\pi f_{aux}}.$$

After a two-dimensional Fourier transformation the position of the disturbance appears in the reconstructed image at positions $x_0$, $x_1'=x_0+D\Lambda x_2'=x_0-D$ wherein $$D = \frac{2\pi f_{aux}}{\gamma_G}.$$

Consequently, the position information of the invasive device will be shifted to the left or right edges of the reconstructed image and the image information of the object remains near the centre within the FOV of the reconstructed image.

In a next step of the method according to the invention the image processing unit 13 separates the Fourier transformed data into position information of the distal end 21 and image information of the object, thus forming two separate images, i.e. one image of the object 7 and one image of the position of the distal end 21.

Figure 5:
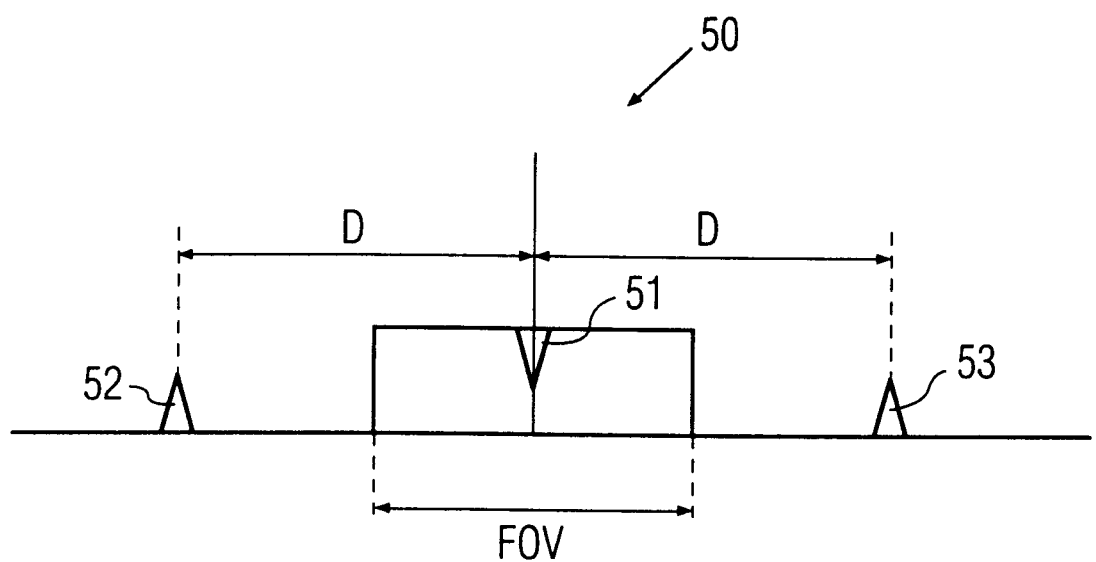
FIG. 5 shows the spectrum of the MR signal along the $k_x$-axis.

FIG. 5 illustrates the principle of the second method. To illustrate the second method it is applied in a one-dimensional example in which a disturbance is induced near the centre of the FOV by a auxiliary magnetic field $B_{aux}$ having a repetition frequency $f_{aux}=BW_s$, wherein $$BW_s = \frac{\gamma G_x FOV}{2\pi}.$$

FIG. 5 shows the spectrum after Fourier transformation of the data. The spectrum 50 contains image information near the centre at a position 51 within the FOV and position information near two positions 52, 53 at a distance D from the centre.

The advantage of the second method in combination with EPI sequences is that the time elapsing between two measurements of MR signals wherefrom the position information is derived is further reduced and hence also motion artefacts.

The signal-to-noise ratio of the position information of the catheter can be further improved by combination of position information near the left edge of the reconstructed image and that near the right edge of the image. For example by addition the information near the left edge of the image and that of the right edge of the image, being corrected for a different phase. This is because according to formula (2) the information present near the position ($x_0$–D) is the same information, be it with an opposite sign, as that present near the position ($x_0$+D). The gain in the signal-to-noise ratio is approximately $\sqrt{2}$.

The strength of the auxiliary magnetic field $B_{aux}(x,y)$ depends on the shape and type of the coil used in the catheter 15. Furthermore, in the second method an upper limit is imposed on the strength of the auxiliary magnetic field $B_{aux}(x,y)$ because a first order approximation is used in the determination of the formula. This upper limit can be estimated by a phase change of $$\frac{\pi}{4}$$

in the magnetization. Furthermore, this phase change should be obtained with half a period of the auxiliary magnetic field, this can be expressed in formula $$\Phi(x, y) < \frac{\pi}{2}.$$

The lower limit of the strength of the auxiliary magnetic field is determined by the required signal-to-noise ratio of the position measurement of the catheter.

A further requirement imposed on the MR device is that the bandwidth of the pass band of the transmitter/receiver circuit 9 and the signal amplification and demodulation unit 10 has to be adapted to pass the higher frequencies in the MR signal. The pass band of the transmitter/receiver circuit has to be, for example, more than three times the original bandwidth $BW_s$. The sampling frequency should be at least six times the original bandwidth $BW_s$.

The position accuracy can be further improved when during the generating of the MR signals for a first image a disturbance is induced by the auxiliary magnetic field under the influence of a current in a first direction and when during the generating of the MR signals for a next image a disturbance is induced by the inverse auxiliary magnetic field under the influence of a current in a direction opposing said first direction.

Figure 4D:
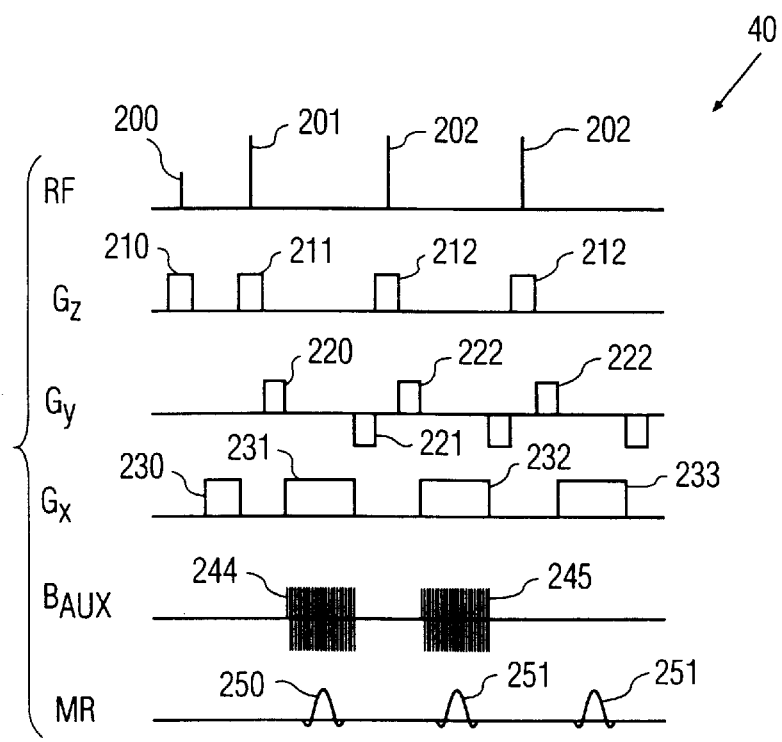

The second method can also be applied in combination with a TSE sequence as described in relation to FIG. 4D. In that combination the periodic auxiliary magnetic fields 244, 245 are applied during the read gradient 231,232. The frequency $f_{aux}$ of the applied auxiliary magnetic field $B_{aux}$, is determined in the same way as is described with reference to the second method in combination with an EPI sequence. Furthermore, the second method can also be applied in combination with a Gradient and Spin Echo (GRASE) sequence.

The MR image acquisition time can be reduced by utilizing, for example, a so-called keyhole method. A keyhole method is known from Patent Application EP-A-543468. According to the keyhole method disclosed in the cited document an MR signal set associated with a complete k-space is used so as to obtain a first reference image. In order to obtain a next image new MR signals are measured for only a part of the k-space. The MR signals received are subsequently substituted in the positions of the MR signals associated with this part of the k-space previously obtained and are stored in a memory of the image reconstruction unit 12. The image reconstruction unit 12 subsequently determines the next image from the updated MR signal set.

In order to track the position of the catheter during the intervention in a further embodiment of an MR system its position is automatically determined from the image as well as a position of a next slice to be imaged in the object. To this end the position information is applied to the control unit 11 which adapts the RF-excitation pulses and the slice-selection gradient according to the catheter position derived. The effect of tracking is that the position of the invasive device within the image of a slice is continuously monitored, during movement of the invasive device or the body.

All references cited herein are incorporated herein by reference in their entirety and for all purposes to the same extent as if each individual publication or patent or patent application was specifically and individually indicated to be incorporated by reference in its entirety for all purposes.

We claim:

1. An MR system for interventional procedures, comprising:
    a magnet for generating a steady magnetic field in an object,
    means for generating temporary magnetic fields in the object, the temporary magnetic fields having gradients in orthogonal directions,
    means for generating RF pulses in the object,
    means for measuring MR signals from the object,
    an invasive device for introduction into the object, and which comprises means for generating an auxiliary magnetic field and control means for generating signals controlling the means for generating temporary magnetic fields, the means for generating RF pulses, and the means for generating the auxiliary magnetic field, so that the measurement of MR signals for determining an image of an object comprises scanning k-space along a plurality of lines, with the auxiliary magnetic field being periodically applied a plurality of times during the scanning of k-space, and processing means both for processing measured MR signals to determine an image of the object, and also for processing changes in the measured MR signals induced by the periodically applied auxiliary magnetic field to determine a position of the invasive device within the image of object.

2. An MR system as claimed in claim 1, wherein the control means generates signals so that the time during which the auxiliary magnetic field is applied in each periodic period is shorter than the time for scanning a single line in k-space space being scanned two times, the processing means being further arranged to determine a position of the invasive device by subtraction of two measured MR signals.

3. An MR system as claimed in claim 2, wherein the control means generates signals for fast MR imaging sequences.

4. An MR system as claimed in claim 3, wherein the control means generates signals for an MR keyhole technique.

5. An MR system as claimed in claim 3, wherein the control means generates signals so that the position of a next slice to be imaged in the object is determined from the position of the invasive device, determined by the processing means.

6. An MR system as claimed in claim 2, wherein the control means generates signals so that the position of a next slice to be imaged in the object is determined from the position of the invasive device, determined by the processing means.

7. An MR system as claimed in claim 1, wherein the control means generates signals for fast MR imaging sequences.

8. An MR system as claimed in claim 7, wherein the control means generates signals for an MR keyhole technique.

9. An MR system as claimed in claim 7, wherein the control means generates signals so that the position of a next slice to be imaged in the object is determined from the position of the invasive device, determined by the processing means.

10. An MR system as claimed in claim 1, wherein the control means generates signals so that the position of a next slice to be imaged in the object is determined from the position of the invasive device, determined by the processing means.

11. The MR system of claim 1 wherein the control means generates signals so that during the scanning of k-space each line of the k-space is scanned twice, once with and once without the auxiliary magnetic field applied.

12. The MR system of claim 11 wherein during the scanning of k-space each line of the k-space is scanned with and scanned without the auxiliary magnetic field applied before additional lines of k-space are scanned.

13. The MR system of claim 1 wherein the control means generates signals so that during the scanning of k-space three lines of the k-space are scanned with and the same three lines of k-space are scanned without the auxiliary magnetic field applied before additional lines of k-space are scanned.

14. The MR system of claim 1 wherein the processing means processes changes in the measured MR signals by subtraction of a first and a second measured MR signal, the first and the second measured MR signals corresponding to the same line in the k-space, the first MR signal measured with and the second MR signal measured without the auxiliary magnetic field applied.

* * * * *